United States Patent [19]
Buss et al.

[11] 4,001,797
[45] Jan. 4, 1977

[54] ANNUNCIATOR SYSTEM WITH DIRECT FIELD WIRING

[75] Inventors: Gerald H. Buss, Walworth; Chester H. Clarridge, Pittsford; Daniel H. Hollands, Webster, all of N.Y.

[73] Assignee: Rochester Instrument Systems, Inc., Rochester, N.Y.

[22] Filed: Dec. 17, 1974

[21] Appl. No.: 533,524

[52] U.S. Cl. .................. 340/181; 317/101 DH; 339/198 R
[51] Int. Cl.² .................................. G08C 9/00
[58] Field of Search .... 317/101 C, 101 R, 101 DH; 339/198 R, 198 H, 198 S, 17 LM, 17 L, 17 LG, 176 M, 176 MP; 340/181

[56] References Cited
UNITED STATES PATENTS

| | | | |
|---|---|---|---|
| 2,735,994 | 2/1956 | Obszarny | 339/198 R |
| 3,375,408 | 3/1968 | Buhrendorf et al. | 317/101 CB |
| 3,573,558 | 4/1971 | Babcock | 317/101 DH |
| 3,766,550 | 10/1973 | Vendermore et al. | 317/101 DH |

FOREIGN PATENTS OR APPLICATIONS

| | | | |
|---|---|---|---|
| 192,070 | 10/1964 | Sweden | 339/176 MP |

*Primary Examiner*—David Smith, Jr.
*Attorney, Agent, or Firm*—Eliot S. Gerber

[57] ABSTRACT

An annunciator or similar system includes a plurality of field terminal blocks whose terminals are connected to the field wiring, the field terminal blocks removably fitting within handle terminal blocks. The handle terminal blocks are fixed to module circuit boards which removably fit in an elongated channel member and have along one of their edges a set of contact areas which make contact with terminals fixed on the bottom wall of the channel member. The terminals of the field terminal block are angled relative to the bottom of the block and are parallel to one another.

8 Claims, 8 Drawing Figures

ANNUNCIATOR SYSTEM WITH DIRECT FIELD WIRING

BACKGROUND OF THE INVENTION

The present invention relates to annunciator and similar systems.

An annunciator is an alarm or monitoring device employed to call the attention of an operator to a change of condition. For example, in a modern oil refinery or chemical plant the process may be monitored by a variety of instruments, for example, thermocouples and other testing transducers. These instruments are electrically connected to field transmitters which, by means of connecting wire, transmit their analog signals to the control location, for example, a main control room.

At the control location the wiring, called "field wiring," from the field transmitters is connected to field terminals, generally the terminals of a terminal block, usually by screw connections.

Each field wiring terminal may be arranged on one side of a switch closure and a second terminal arranged on the opposite side of the switch. The two terminals are electrically connected by the normally open or normally closed switch. The second terminal is then hand-wired to a terminal in a separate input terminal block, usually located in an adjacent rack. That input terminal block is connected to printed circuit boards containing the solid-state electronic logic of the annunciator system. The output of the annunciator logic is connected by wires to the visual display or buzzer or other type of warning device, and the warning devices are often located in a main control room.

The hand-writing of connecting wires from the field wiring to the terminal block for the annunciator logic is relatively time consuming and expensive. If such connecting wiring is to be later changed, because of changes in the system, it may require an additional expenditure of time and money to rewire, by hand, the various connections. In addition, as in any hand-wired system, a chance for error exists. To avoid such error and to provide for subsequent maintenance and system changes, it is generally required to write an extensive, and expensive, documentation of the hand-wired system.

In a typical system more than 100 field transmitters may be connected in a single annunciator system for the purpose of monitoring the transducers connected to the field transmitters and to provide alarms upon predetermined changes in the processes being monitored. The field wiring may be connected to terminals in a rack located below a control room. The racks may be connected to annunciator display panels which consist of separate lights in back of small lettered translucent panels.

An example of the system's operation is that upon an unwanted temperature drop in a vessel a light will flash in the control room lighting a small panel saying, "temperature drop No. 10 vessel."

SUMMARY OF THE INVENTION

In accordance with the present invention an annunciator, or similar, system is provided in which the amount of hand-wiring is reduced, providing an annunciator system which is relatively lower in cost and yet is accurate as to its wiring and may be readily changed upon alterations in the system.

In the system of the present invention the field wiring, from the field transmitters, is connected to terminals in a small removable field terminal block, preferably containing only four screw contacts. The field terminal block has a plurality, preferably four, parallel faces which are inclined at an angle to the bottom of that block. Preferably the angle will be about 45° relative to the vertical. The screw contacts are screwed into conductive plates mounted on the slanted faces of the field terminal block. The field wiring is connected at an angle to permit it to be connected to each field terminal block without passing over the other field terminal blocks, thereby permitting removal of any field terminal block, or any module, without disturbing the other field wiring or the other modules.

The small field terminal blocks are keyed to fit within individual handle terminal blocks. Each handle terminal block has two oppositely extending wing portions forming a handle, and female connector sockets to receive the male connector prongs extending from the field terminal block.

The handle terminal block is permanently connected to a module circuit board near one edge of the module circuit board. The module circuit board has mounted thereon the components forming the solid-state electronic logic for the annunciator system. The module circuit boards are removably mounted in top and bottom slits in an elongated channel member whose bottom has edge connectors each of which makes electrical contact with its respective module circuit board. The channel member containing the modules is mounted on a large "mother" circuit board to which the connectors at the bottom of the channel are electrically connected. The mother board has top and bottom channel shaped support members for mounting the assembly in a rack.

It is, consequently, an objective of the present invention to provide an annunciator or similar system in which the field wiring is wired to terminals which directly connect to circuit board modules.

It is a further objective of the present invention that the system be readily and easily altered, and for that purpose the field terminal block may be removed from the handle terminal block.

It is a feature of the present invention to provide a terminal system for an annunciator or similar system comprising a "mother", i.e., first, printed circuit board which has thereon wires forming a plurality of circuits. A top support member and a bottom support member are each secured to the mother board at respectively near its top and bottom portions. An elongated channel member is secured to the mother circuit board and has a bottom wall and two side walls. A plurality of connector members is secured to the bottom wall of the channel member and is electrically connected to the mother printed circuit board. A plurality of module circuit boards, each having contact means near one of its sides, is slid into receiving means on the two side walls of said channel member, the receiving means being in facing relationship to physically removably position the module circuit boards. An electrically insulative handle terminal block is fastened to each of said module circuit boards at the side opposite its contact means. Each of the handle terminal blocks has a handle portion, a plurality of conductive connector means, and means connecting each of said connector members to the wires on its module printed board. The terminal system also includes a plurality of electrically insulative field terminal block members, each field terminal block member being formed so it may be removably fitted to each of the handle terminal members. Each field terminal block member has a plurality of inner conductive connector members which makes electrical contact with the connector members of said handle, and an outer conductive connector member to removably fasten field wiring thereto, the inner and outer conductive members being electrically connected. Each of the field terminal block members has a plurality of faces parallel to each other and angled relative its bottom face, each of the angled faces carrying thereon one of the outer connector members.

It is a further feature of the present invention to provide a printed circuit board module comprising a printed circuit board having wiring formed thereon and a plurality of female conductive connectors fixed near one of its edges, and a plurality of contact means near its opposite edge. An insulative handle terminal block having a body portion and opposite extending handle portions is fixed near the same edge of said printed circuit board as the female connectors, the body portion having opening means to allow the female connectors to be open at an edge of the circuit board. An insulative field terminal block removably fits in the handle terminal block, the field terminal block having an inward face and an outer face having a plurality of protrusions with slanted walls. The slanted walls are angled relative to the bottom face and are parallel to each other. Each of the angled walls carries a connector terminal and the bottom face carries a plurality of protruding connector prongs each of which is connected to one of said connector terminals on the slanted wall.

BRIEF DESCRIPTION OF THE DRAWINGS

Other objectives of the present invention will be apparent from the detailed description which follows, providing the inventors' best mode of practicing the invention, which description should be taken in conjunction with the accompanying drawings.

In the accompanying drawings.

DETAILED DESCRIPTION OF THE INVENTION

The following detailed description of the present invention provides the inventors' best mode of practicing the invention in connection with an annunciator or similar system. The terminal system of the present invention may be applicable to other than annunciator systems, for example, in large-scale analog computers, large scale hybrid computers, or in other types of electrical and electronic systems.

Figure 1:
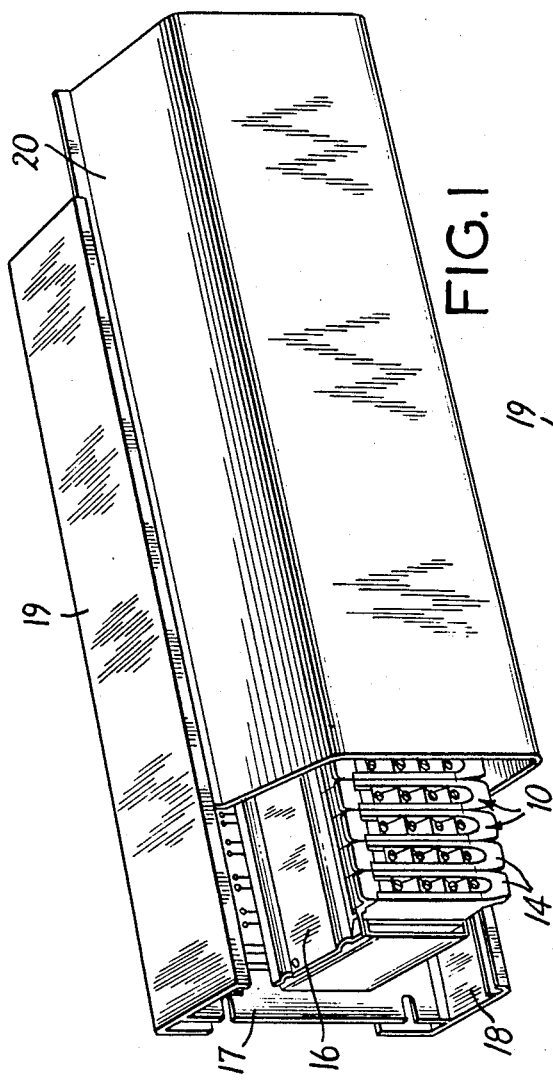
FIG. 1 is a perspective view of the terminal assembly of the annunciator system of the present invention.
Figure 2:
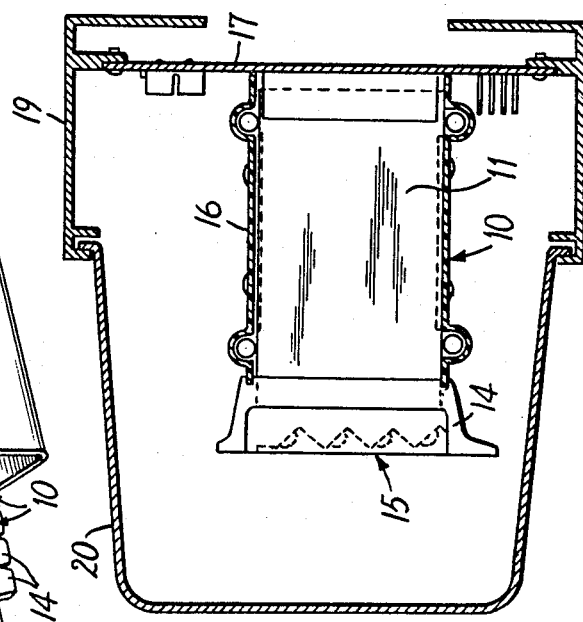
FIG. 2 is a side cross-sectional view of the terminal assembly of FIG. 1.

As shown in FIGS. 1 and 2, the annunciator, or similar, system of the present invention is based upon a set of plug-in modules 10. Each module 10 consists of a printed circuit board 11 having on one or both of its faces a set of printed wiring. The various components, such as capacitors, resistors and solid-state integrated circuits, are mounted on the circuit board 11 and the terminals of the various components are soldered to the printed wiring. The printed wiring terminates in a set of gold-plated contact terminal areas 13 which are small rectangular gold-plated areas aligned along the back edge of both sides of the printed circuit board 11.

A handle terminal block 14 is fixed to the opposite side of the printed circuit board 11. A field terminal block 15 removably fits within a portion of the handle terminal block 14. The circuit board 11 and its logic and the two terminal blocks 14 and 15 form a plug-in module which is positioned alongside of similar module assemblies in an elongated channel member 16. The channel member 16 has a plurality of top and bottom plastic slides on its facing side walls and each pair of slides receives and positions one of the circuit board modules. A bottom wall of the channel 16 is fitted with a plurality of connectors, preferably having spring-loaded bifurcated contacts, each of which contactors is removably connected to one of the set of terminal areas 13 on its corresponding circuit board.

The channel member 16 is mounted on a relatively stiff and large printed circuit board 17 called the "mother" board and the connectors mounted on the bottom wall of the channel member 16 are electrically connected to the wires plated upon the mother circuit board 17. The top and bottom of the mother board 17 have mounted thereon top and bottom support members which are respective elongated aluminum channels 18 and 19. The channels 18 and 19 fit within a conventional rack for electronic equipment (not shown). A cover 20 is somewhat flexible so that it fits under lips extending from the channel members 18 and 19.

Figure 4:
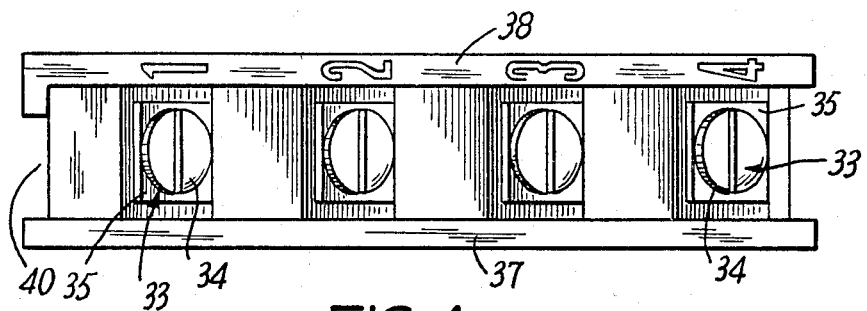
FIG. 4 is a front plan view of the field terminal block.
Figure 5:
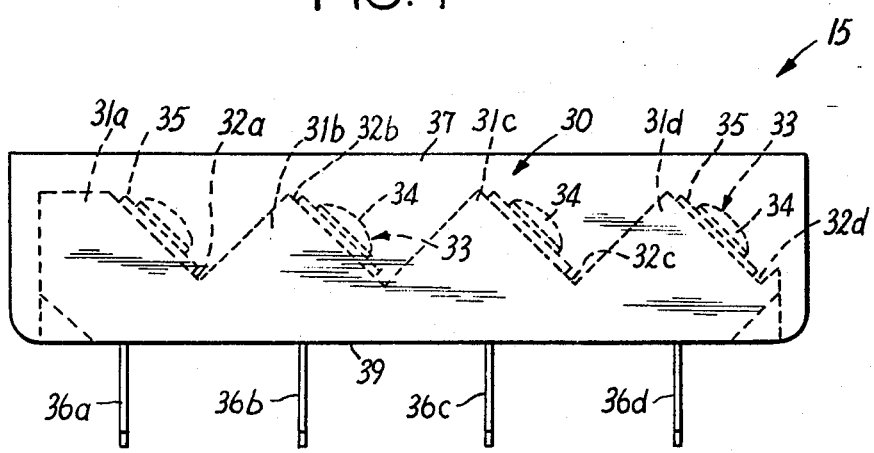
FIG. 5 is a side plan view of the field terminal block of FIG. 4.
Figure 6:
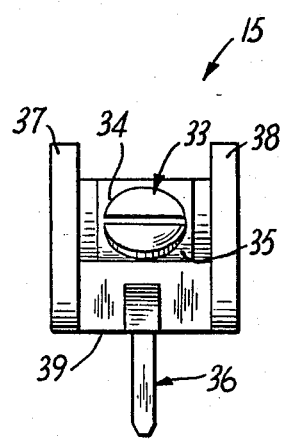
FIG. 6 is an end plan view of the field terminal block of FIG. 4, the FIGS. 4,5,6 being enlarged in scale relative to the scale of FIGS. 1 and 2.

A detailed view of the field terminal block is shown in FIGS. 4, 5 and 6. As shown in those figures, the field terminal block 15 consists of an integral plastic member molded in one piece out of a suitable plastic resin having high mechanical stability and high electrical insulative values, for example, of black colored nylon. The field terminal block 15 consists of a central portion 30 formed into four raised portions 31a, 31b, 31c and 31d. The raised portions 31a through 31d each have a slanted face, respectively 32a, 32b, 32c and 32d, which face is at a 45° angle relative to the bottom face 39 of the terminal block and parallel to the other slanted faces. Each of the slanted faces 32a through 32d is provided with a cavity.

A metal conductive outer connector plate 35 is secured on each of the slant faces 32a through 32d. Each metal connector plate 35 has a threaded screw hole therein in which is threaded a contact screw 33 having a screw head portion 34. The connector plates 35 are fastened within the block 15 by means of a flange on one end of each plate 35 which protrudes down within a slit at one side of its cavity within the slanted face, that flange having extending arms to secure the flange within the field terminal block 15. A second flange on the other side of each conductive connector plate 35 extends all the way through the field terminal block 15 and is integral with a metal extending prong 36, which is the inner connector prong, and is a male connector.

As shown in FIG. 5, there are consequently four inner connector prongs 36a, 36b, 36c and 36d. It will be understood that the description of the inner and outer connectors applicable to the first connector is equally applicable to the three other connectors mounted on the field terminal block 15.

The central portion 30 of the field terminal block has two upwardly raised side portions 37 and 38 integral therewith. The right side portion has the numbers 1, 2, 3 and 4 embossed thereon as an indication of the numbers of the terminals. In this embodiment the screw 33 directly screws into the outer connector plate 35 and freely moves within the field connector block. It will be understood that, alternatively, a washer or other metal member may be placed beneath the screw head with the washer electrically connected to the inner connector prong 36 and the terminal block may itself be screw-threaded. The bottom face 39 of the field connector block 15 is flat and consequently the slanted faces 32a–32d are each at an angle of approximately 45° relative to the bottom face 39.

As shown in FIG. 4, there is a channel 40 at the top of the field connector block 15, which channel is a key means so that the field connector block may be inserted within the handle terminal block 14 in only one direction.

Figure 3:
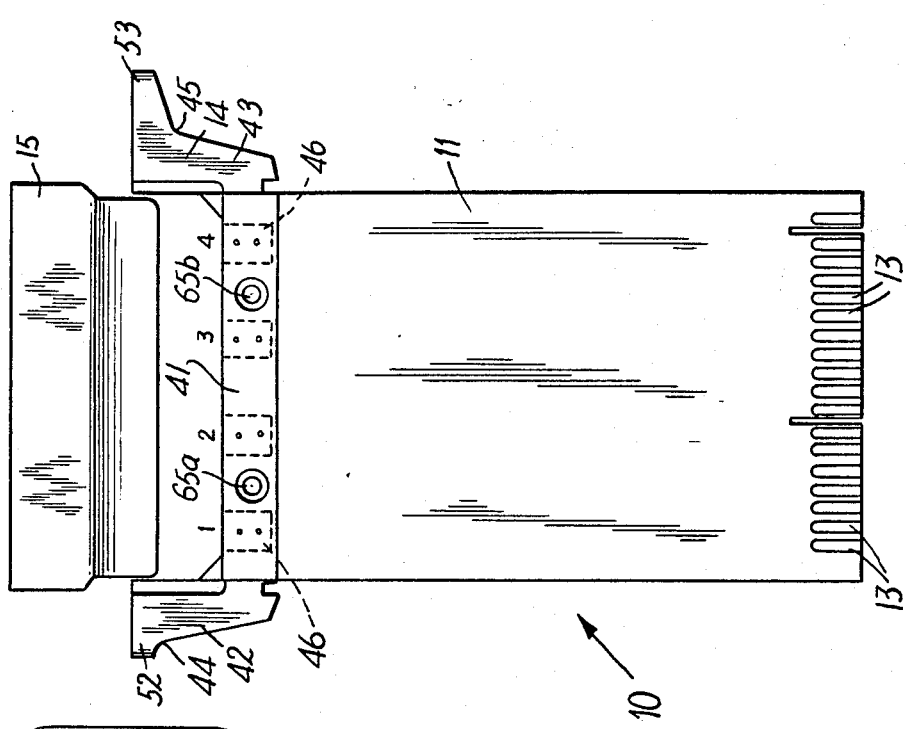
FIG. 3 is a top plan view of the field terminal block, the handle terminal block and the circuit board module used in the present invention prior to insertion of the field terminal block into the handle terminal block.
Figure 7:
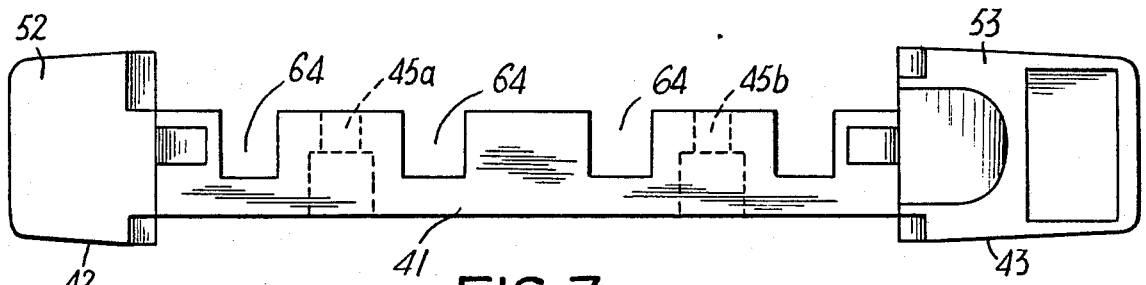
FIG. 7 is a front plan view of the handle terminal block as used in the present invention, the FIG. 7 being enlarged in scale relative to the FIGS. 1 and 2.

The handle terminal block is shown in FIGS. 3 and 7. It consists of an elongated body portion 41 which is square in cross-section. The body portion is integral with a raised left handle portion 42 and a right handle portion 43. Each of the handle portions has a curved surface, respectively 44 and 45, and an extending portion therefrom, respectively 52 and 53. The curved surfaces 44 and 45 and the extending portions 52 and 53 permit the handle to be gripped, thereby facilitating the placement and removal of the module.

The body portion 41 of the handle terminal block 14 has four channels 64 therethrough. These channels fit over female spring-loaded connectors 46. The body portion 41 is connected to the module circuit board 11 by means of two rivets which fit through holes 65a and 65b. The spring-loaded female connectors 46, one of which is located in each of the four channels 44, are each connected by solder to the wiring of the circuit board.

Figure 8:
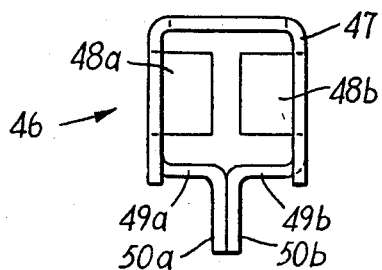
FIG. 8 is an end plan view of one of the female connectors of the circuit board module, the FIG. 8 being enlarged in scale.

As shown in FIG. 8, each of the female connectors 46 consists of an inverted U-shaped member 47 having two inwardly directed spring arms 48a and 48b. The inverted U-shaped member 47 has integral therewith two downwardly extending arms 49a and 49b each having a lower extending portion, respectively 50a and 50b, which lower extending portions 50a, 50b protrude through the circuit board and are soldered thereto.

Modifications may be made in the above-detailed description within the scope of the sub-joined claims. For example, although the field terminal block is shown with four screw terminals, the number may be more or less than four and the terminals may be other than the screw type of terminal.

We claim:

1. A terminal system for an annunciator or similar system comprising
a first printed circuit board which has thereon wires for a plurality of circuits, a top support member and a bottom support member each secured to said board at respectively near its top and bottom portions,
an elongated channel member secured to said first circuit board and having a bottom wall and two side walls, a plurality of connector members secured to said bottom wall and electrically connected to said first printed circuit board,
a plurality of module circuit boards each having conductive contact means near one of its sides which contact said connector members on said first printed circuit board, means on said two side walls of said channel member in facing relationship to removably position said module circuit boards,
an electrically insulative handle terminal block fastened to each of said module circuit boards at the side opposite said connector means, each of said handle terminal blocks having a handle portion, a plurality of conductive connector members, and means connecting each of said connector members to the wires on its module printed circuit board,
a plurality of electrically insulative field terminal block members, each terminal block member being removably fitted to each of said handle members, each having a plurality of inner conductive connector members which make electrical contact with said connector members of said handle and each having an outer conductive connector member to removably fasten field wiring thereto, said inner and outer conductive members being electrically connected and each of said field terminal block members having a plurality of faces parallel to each other and angled relative its bottom face, each of said faces carrying thereon one of said outer connector members.

2. A terminal system as in claim 1 wherein said faces are at an angle of substantially 45° relative to said bottom face.

3. A terminal system as in claim 1 wherein the connector members on said handle terminal member are female connector members and are spring-loaded openings and the said inner connector members are male connector members and are metal protruding prongs.

4. A printed circuit board module comprising a printed circuit board having wiring formed thereon, a plurality of female conductive connectors fixed near one edge of said circuit board, a plurality of conductive contact means fixed near the opposite edge of said circuit board from said female connectors, an insulative handle terminal block having a body portion and opposite extending handle portions, said handle terminal block being fixed near the same edge of said printed circuit board as said female connectors, said body portion having opening means to allow said female connectors to be open at said edge of said circuit board, and an insulative field terminal block which removably fits in said handle terminal block, said field terminal block having an inward face and an outer face having a plurality of protrusions having slanted walls, said slanted walls being angled relative to said bottom face and being parallel to each other, each of said angled walls carrying a connector terminal, and said bottom face having a plurality of protruding connector prongs each connected to one of said connector terminals on said slanted wall, wherein said connector prongs fit within said female connectors.

5. A printed circuit board module as in claim 4 wherein said female connectors are fixed onto said circuit board near one edge of said circuit board and said means opening is a plurality of channels through said handle terminal block each of which channels fits over one of said female connectors.

6. A printed circuit board module as in claim 4 wherein said angle of said slanted faces relative to said inner face is substantially 45°.

7. In an annunciator system including a plurality of field transmitters, field wiring and a terminal system, said field transmitters each producing an analog signal representing a change in condition, said field wiring comprising a plurality of pairs of wires and each pair of wires being connected to one of said field transmitters and to said terminal system;

said terminal system comprising a channel member, a plurality of connector members associated with said channel members, and a plurality of terminal block assemblies;

each of said terminal block assemblies including terminal means, said terminal means being directly wired to said field wiring, a printed circuit board having thereon a printed circuit and electronic circuitry means directly wired to said printed circuit, said circuit board having conductive contact means near one of its sides and said terminal means being attached to said circuit board near its side opposite to the side having said conductive contact means;

said electronic circuitry means being a solid-state electronic logic with said printed circuit and providing therewith an alarm signal upon receiving an analog signal from one of said field transmitters;

wherein in said terminal system the said terminal block assemblies are removably mounted in a side-by-side arrangement in said channel member and said conductive contact means removably contact said connector members.

8. An annunciator system as in claim 7 wherein said electronic circuitry means includes at least one integrated circuit and said integrated circuit is connected and fastened directly to said circuit board.

* * * * *